United States Patent
Chen

[19]

[11] Patent Number: 6,049,498
[45] Date of Patent: Apr. 11, 2000

[54] DOUBLE TRANSISTOR SWITCH FOR SUPPLYING MULTIPLE VOLTAGES TO FLASH MEMORY WORDLINES

[75] Inventor: Chun Chen, Emmaus, Pa.

[73] Assignee: Lucent Technologies, Inc., Murray Hill, N.J.

[21] Appl. No.: 09/100,124

[22] Filed: Jun. 19, 1998

[51] Int. Cl.[7] .................................................. G11C 7/00
[52] U.S. Cl. ......................... 365/226; 365/185.23
[58] Field of Search ............................ 365/226, 189.09, 365/230.06, 185.23; 327/365

[56] References Cited

U.S. PATENT DOCUMENTS 4,228,528  10/1980  Cenker et al. .
4,823,318   4/1989  D'Arrigo ................................. 365/218
5,682,348  10/1997  Lin ..................................... 365/189.11

*Primary Examiner*—A. Zarabian
*Attorney, Agent, or Firm*—Dickstein Shapiro Morin & Oshinsky LLP

[57] ABSTRACT

The present invention is directed to a method and apparatus for switching a selected one of a plurality of voltage supplies, each having a respective amplitude, to a wordline of a Flash memory, while providing isolation between the other unswitched voltage supplies and the wordline. By utilizing two symmetrically configured switching transistors, a selected supply voltage can be passed to the wordline when the transistors are on, and the non-selected supply voltages will be reliably isolated from the wordline when the transistors are off regardless of the polarity of the voltage difference between the non-selected voltage supplies and the wordline.

15 Claims, 4 Drawing Sheets

DOUBLE TRANSISTOR SWITCH FOR SUPPLYING MULTIPLE VOLTAGES TO FLASH MEMORY WORDLINES

BACKGROUND OF THE INVENTION

1. Field of the Invention

The present invention relates to an electronic circuit for switching the voltage applied to a memory circuit, and in particular to a method and apparatus for switching one of any number of voltage supplies with varying amplitudes to the wordlines of a Flash memory while providing isolation between the unswitched voltage supplies and the wordlines.

2. Description of the Prior Art

Common types of non-volatile memory, such as EPROM (Electrically Programmable Read Only Memory), EEPROM (Electrically Erasable Programmable Read Only Memory) and Flash memory use a charge on a memory cell's floating gate to control the threshold voltage (Vt) of the memory cell and thereby indicate the binary state of the cell. Typically, such memory cells have two possible binary states, one (e.g. "1") indicated by a high threshold voltage and one (e.g. "0") indicated by a low threshold voltage. Gathering electrons on a memory cell's floating gate increases the cell's threshold voltage and is referred to as writing or programming the memory cell. Erasing a memory cell removes the electrons from the floating gate and reduces the threshold voltage.

A Flash memory includes an array of electrically programmable and electrically erasable memory cells. Typically, each memory cell comprises a single n-channel metal oxide semiconductor (NMOS) transistor, which has the floating gate positioned between a control (input) gate and a channel located between the source and drain of the transistor. The threshold voltage Vt, adjusted by the charge stored on the floating gate, is the voltage that must be overcome by the gate to source voltage to activate the device.

For example, the threshold voltage Vt for a typical flash memory transistor with no charge stored on its floating gate is approximately one or two volts. This means that a voltage of at least two volts must be applied between the control gate and the source junction for the device to activate, that is, to allow current to flow through the device. The threshold voltage Vt for a typical flash memory transistor with charge stored on the floating gate is 6 volts. This means that a voltage of at least six volts must be applied between the control gate and the source junction for the device to activate, that is, to allow current to flow through the device.

The memory cells in the array are accessed via a plurality of column lines (digit lines) and a plurality of row lines (wordlines). Each of the wordlines is coupled to a control gate of a corresponding memory cell transistor. The activation of a cell, as noted above, occurs by supplying a voltage to the wordline to overcome the threshold voltage. The voltage level applied will depend upon the memory function desired, i.e. write, erase, read, etc. Thus, the write, erase, read and testing of a Flash memory chip requires that multiple voltages be supplied to the wordlines of the memory array at different times.

The multiple voltages necessary to be supplied to the Flash memory wordlines typically range from 1.5V to 7V. For example, Flash memory wordlines usually should be supplied with power supply voltage Vdd (3.3V) in a normal read operation, with 1.5–3.0V in a margin mode read operation and in a threshold voltage convergence after erase operation, and with 5.0–7.0V in a write operation. These voltages usually come from on-chip charge pumps or power supply pins such as Vdd.

Typically, a transistor circuit is used to control the switching of the multiple voltages to the Flash memory block wordlines and to provide isolation between each voltage supply and the wordlines biased at a higher or lower voltage by the other sources of voltage supply. An example of such a circuit is shown in FIG. 1.

Switching circuit 10 of FIG. 1 is used to switch voltage Vin1 12 or voltage Vin2 14 to a single output Vout 16. Voltages Vin1 12 and Vin2 14 are any two of the voltages used to control the functioning of the Flash memory block. The wordlines of the Flash memory block are connected to Vout 16. Transistors 20 and 22 are used as the switch transistors. The circuit is controlled by control signals PASS1 25 and PASS2 27, which are typically in the magnitude of 0V or 3.3V. The gate of transistor 20 is biased to either 0V or Vin1 12 by a level-shifter, which consists of level shifting circuit 35 and transistors 30, 31 which form an inverter. The gate of transistor 22 is biased to either 0V or Vout 16 by a second level-shifter, which consists of level shifting circuit 45 and transistors 40, 41 which form an inverter.

Suppose, for example, it is desired to switch voltage Vin1 12 to Vout 16. It will then also be necessary to suitably isolate Vin2 14 from Vout 16. In order to switch Vin1 12 to Vout 16, node N2 is set to 0V by control signal PASS1 25, level shifting circuit 35, and inverter formed by transistors 30, 31 in the following manner. Control signal PASS1 25 input to level shifting circuit 35 would be set to 3.3V. The signal output from level shifting circuit 35 at node N1 would be Vin 1 12. Transistor 30 would be off, and transistor 31 would be on, thus pulling node N2 to 0V. When node N2 is pulled to 0V, transistor 20 will turn on, thus switching Vin1 12 to Vout 16.

Simultaneously, Vout 16 is isolated from Vin2 14 by setting node N4 to Vout 16 by control signal PASS2 27, level shifting circuit 45 and transistors 40, 41 in the following manner. Control signal PASS2 27 input to level shifting circuit 45 would be set to 0V. The signal output from level shifting circuit 45 at node N3 would be 0V, thus turning on transistor 40 and turning off transistor 41. When transistor 40 is turned on, node N4 will be pulled up to Vout 16. When node N4 is pulled up to Vout 16, transistor 22 is turned off, thus isolating Vout 16 from Vin2 14. Thus, Vout 16 will carry the signal Vin1 12 and be isolated from Vin2 14.

A similar operation with the PASS1 25 and PASS2 27 voltages reversed would connect Vin2 14 to Vout 16 and isolate Vin1 12.

SUMMARY OF THE INVENTION

The present invention provides a unique method and apparatus for switching one of any number of voltage supplies, even those having varying amplitudes, to the wordlines of a Flash memory while providing suitable isolation between the wordlines and the unswitched voltage supplies, regardless of the polarity of the voltage difference between the wordlines and the non-switched voltage supplies.

In a preferred embodiment, each of the supply voltages is associated with a switch which consists of two symmetrically configured switching transistors. To pass the supply voltage to an output of the switch, both switching transistors are turned on. To isolate the output, which may be biased by another voltage supply, from the voltage supply connected to the input of the switch, both switching transistors are turned off. Depending on the polarity of the voltage difference between the output and the voltage supply, at least one of the two switch transistors will always be off and provide the necessary isolation.

DETAILED DESCRIPTION OF THE PREFERRED EMBODIMENTS

Figure 1:
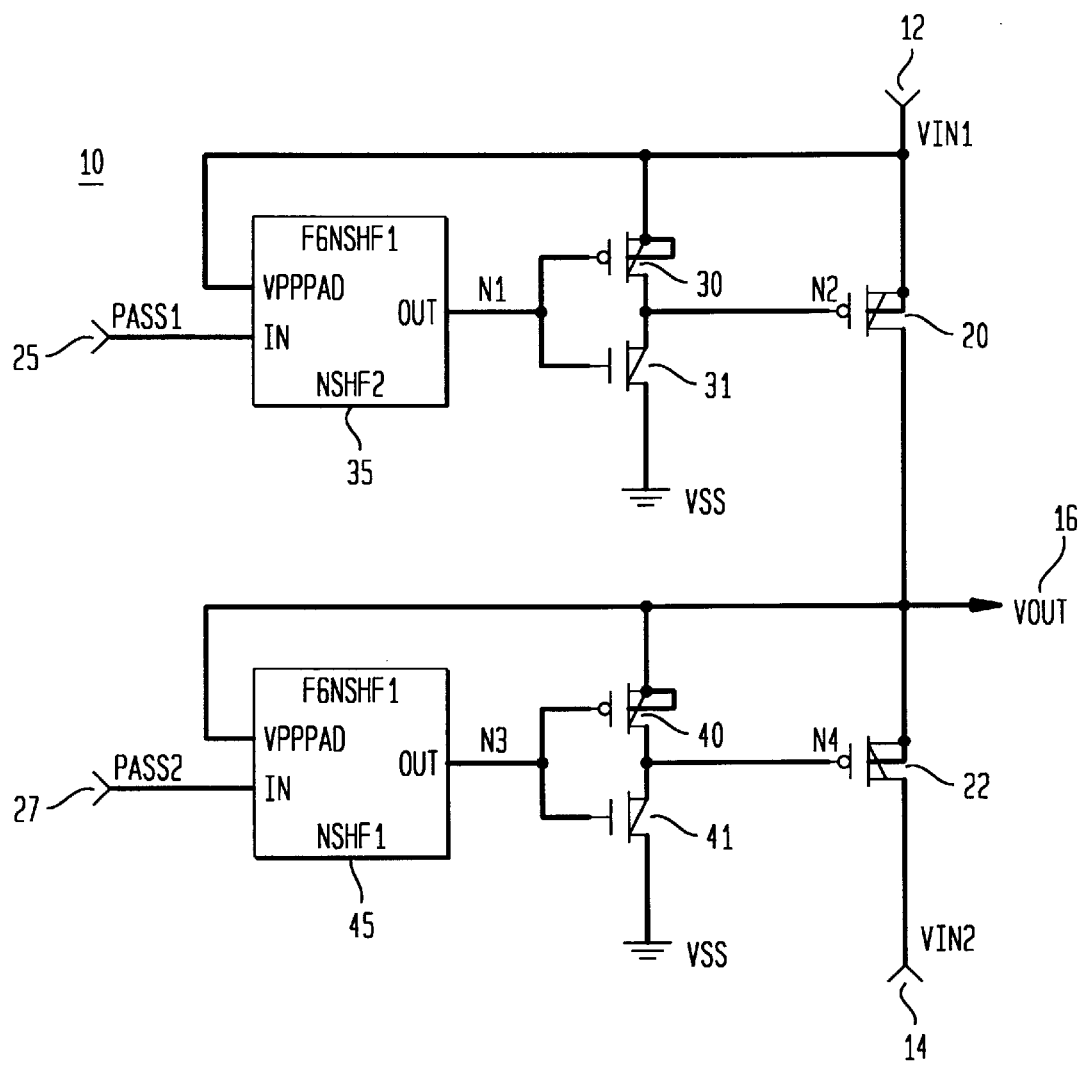
FIG. 1 illustrates in schematic diagram form a prior art switching circuit.

There are several problems with the isolation capabilities of the prior art circuit 10 shown in FIG. 1. Circuit 10 is capable of providing isolation between Vout 16 and Vin2 14 only if the voltage difference between them is of a certain polarity. Transistors 20 and 22 will operate as described above as long as both of the following equations are satisfied:

$$Vin1 > Vin2 - 0.7V \tag{1}$$

$$Vin1 > Vin2 - Vt. \tag{2}$$

However, if Vin1 12 is varied so either of equations (1) or (2) above are no longer satisfied, transistor 22 will lose the ability to isolate Vout 16 from Vin2 14. The junction between Vin2 14 and the substrate of transistor 22 (biased at Vout 16, which is equal to Vin1 12) will be turned on when equation (1) is not satisfied, i.e., Vin1 12<Vin2 14−0.7V, and transistor 22 itself will be conducting when equation (2) is not satisfied, i.e. Vin1 12<Vin2 14−Vt. Likewise, the same problem exists when Vout 16 is to be isolated from Vin1 12.

Thus, there exists a problem of switching the required multiple voltages to the wordlines while reliably providing good isolation between the voltage supply and the wordlines biased at a higher or lower voltage by the other voltage supply sources. The present invention provides a method and apparatus for switching one of any number of voltage supplies, even those having varying amplitudes, to the wordlines of a Flash memory while providing suitable isolation between the wordlines and the unswitched voltage supplies.

Figure 2:
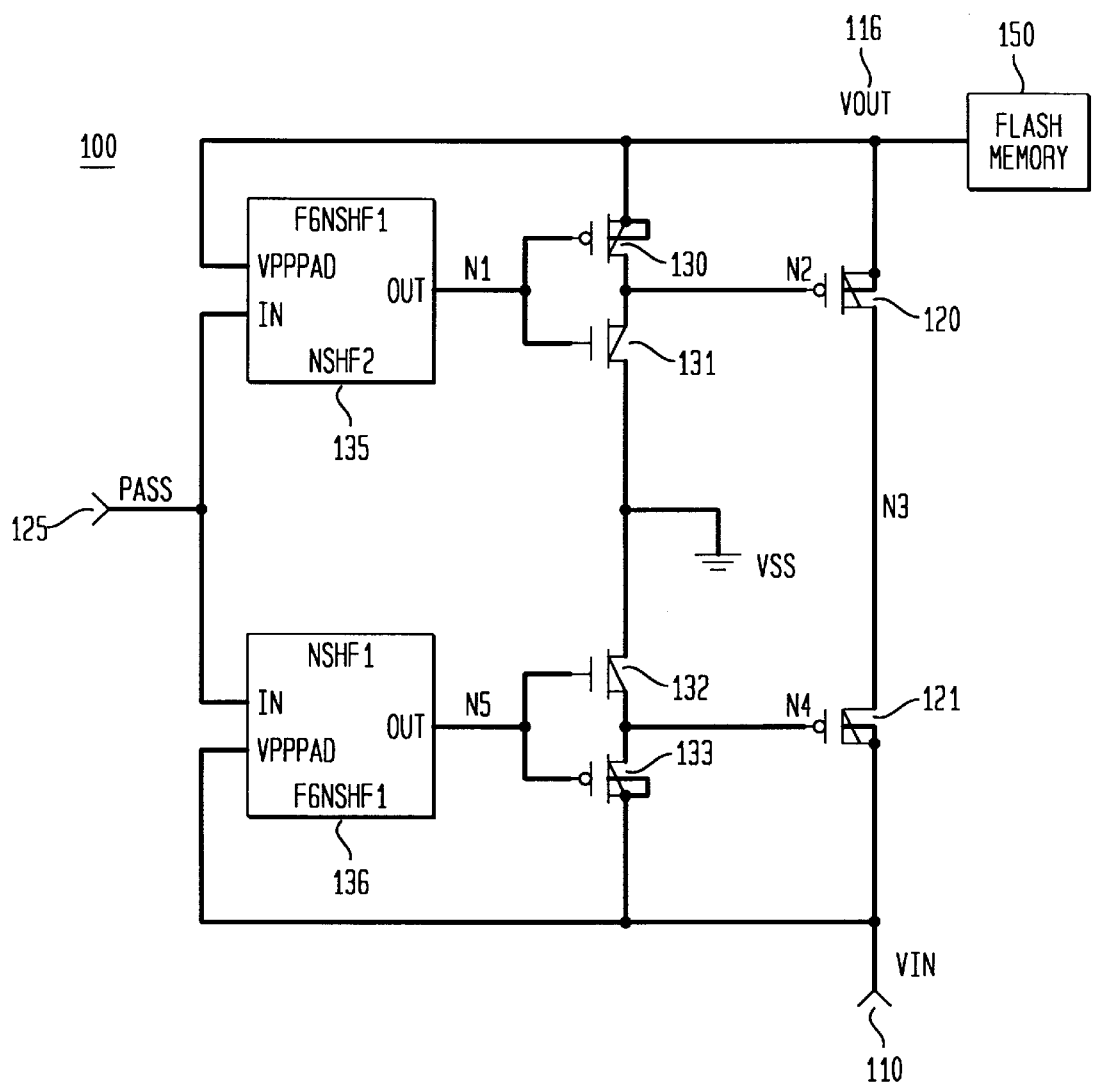
FIG. 2 illustrates in schematic diagram form a switching circuit in accordance with the present invention.

The present invention will be described as set forth in the preferred embodiments illustrated in FIGS. 2–4. FIG. 2 illustrates a switching circuit 100 which may be provided as part of an integrated circuit. Circuit 100 would be used for switching voltage Vin 110 to Vout 116 in accordance with the present invention. Circuit 100 consists of switching transistors 120, 121, and a pair of CMOS inverters, one formed by transistors 130, 131 and the other formed by transistors 132, 133. The circuit is controlled by control signal PASS 125, which is typically in the magnitude of 0V or 3V, and level shifting circuits 135, 136 as are commonly known in the art. Transistors 130, 131, 132, and 133 and level shifting circuits 135, 136 are used for level-shifting the control signal PASS 125 to the right magnitude at node N2 (0V or Vout) and node N4 (0V or Vin) for biasing of the transistors 120, 121 in a similar manner as previously described with respect to FIG. 1.

Transistors 120 and 121 are symmetrically placed between the voltage supply Vin 110 and the output Vout 116. The output Vout 116 would be connected, for example, to at least one wordline (not shown) of a Flash memory 150. When it is desired to bias the wordlines of Flash memory 150 connected to Vout 116 with voltage Vin 110, both transistor 120 and 121 are turned on, and Vin 110 will be conducted to Vout 116. To turn on transistors 120 and 121, nodes N2 and N4 are set to 0V by control signal PASS 125, level shifting circuits 135, 136 and transistors 130–133 as previously described with respect to FIG. 1.

When transistors 120 and 121 are off, Vin 110 will not be conducted to Vout 116. Transistors 120 and 121 are turned off by setting node N2 to Vout 116 and node N4 to Vin 110 by control signal PASS 125, level shifting circuits 135, 136 and transistors 130–133 as previously described with respect to FIG. 1. In the case when Vout 116 is not biased by passing Vin 110 to it, i.e. transistors 120, 121 are off, Vout may be biased by other voltage supplies which would also be connected to the wordlines utilizing identical switching circuits 100. The circuit according to the present invention provides reliable isolation between Vin 110 and Vout 116, when transistors 120 and 121 are off, regardless of the polarity of the voltage difference between them.

For example, if Vout 116 is biased by some other voltage supply which is greater than the value of Vin 110, transistor 120 will isolate Vout 116 from Vin 110 in the following manner. In worst case condition, i.e. transistor 121 provides no isolation, node N3 will float at Vin 110+0.7V. Transistor 120 is biased at node N2 by Vout 116. In order for transistor 120 to remain off, the following two equations must be satisfied:

$$Vout\ 116 > \text{Voltage at node N3} - 0.7V \tag{3}$$

$$Vout\ 116 > \text{Voltage at node N3} - Vt. \tag{4}$$

The voltage at node N3 will be at most Vin 110+0.7V as given above. Substituting for the voltage at node N3 in the above equations (3) and (4) yields the following:

$$Vout\ 116 > Vin\ 110 \tag{5}$$

$$Vout\ 116 > Vin\ 110 + 0.7V - Vt. \tag{6}$$

Since Vout 116 is greater than Vin 110, equation (5) will be satisfied. Furthermore, since Vt will be some value greater than 0.7V, i.e. 2V or 6V, and Vout 116 is greater than Vin 110, equation (6) will always be satisfied and transistor 120 will reliably isolate Vout 116 from Vin 110.

Similarly, if Vout 116 is biased by some other voltage supply which is less than the value of Vin 110, transistor 121 will isolate Vout 116 from Vin 110 in the following manner. In worst case condition, i.e. transistor 120 provides no isolation, node N3 will float at Vout 116+0.7V. Transistor 121 is biased at node N4 by Vin 110. In order for transistor 121 to remain off, the following two equations must be satisfied:

$$Vin\ 110 > \text{Voltage at node N3} - 0.7V \tag{7}$$

$$Vin\ 110 > \text{Voltage at node N3} - Vt. \tag{8}$$

The voltage at node N3 will be at most Vout 116+0.7V as given above. Substituting for the voltage at node N3 in the above equations (7) and (8) yields the following:

$$Vin\ 110 > Vout\ 116 \tag{9}$$

$$Vin\ 110 > Vout\ 116 + 0.7V - Vt. \tag{10}$$

Since Vin 110 is greater than Vout 116, equation (9) will be satisfied. Furthermore, since Vt will be some value greater than 0.7V, i.e. 2V or 6V, and Vin 110 is greater than Vout 116, equation (10) will always be satisfied and transistor 121 will reliably isolate Vout 116 from Vin 110.

Thus, independent of the polarity of the voltage difference between the output Vout 116 and the voltage supply Vin 110, the double transistor combination of transistors 120, 121 provides reliable isolation between Vout 116 and Vin 110 when transistors 120, 121 are in the off state.

Figure 3:
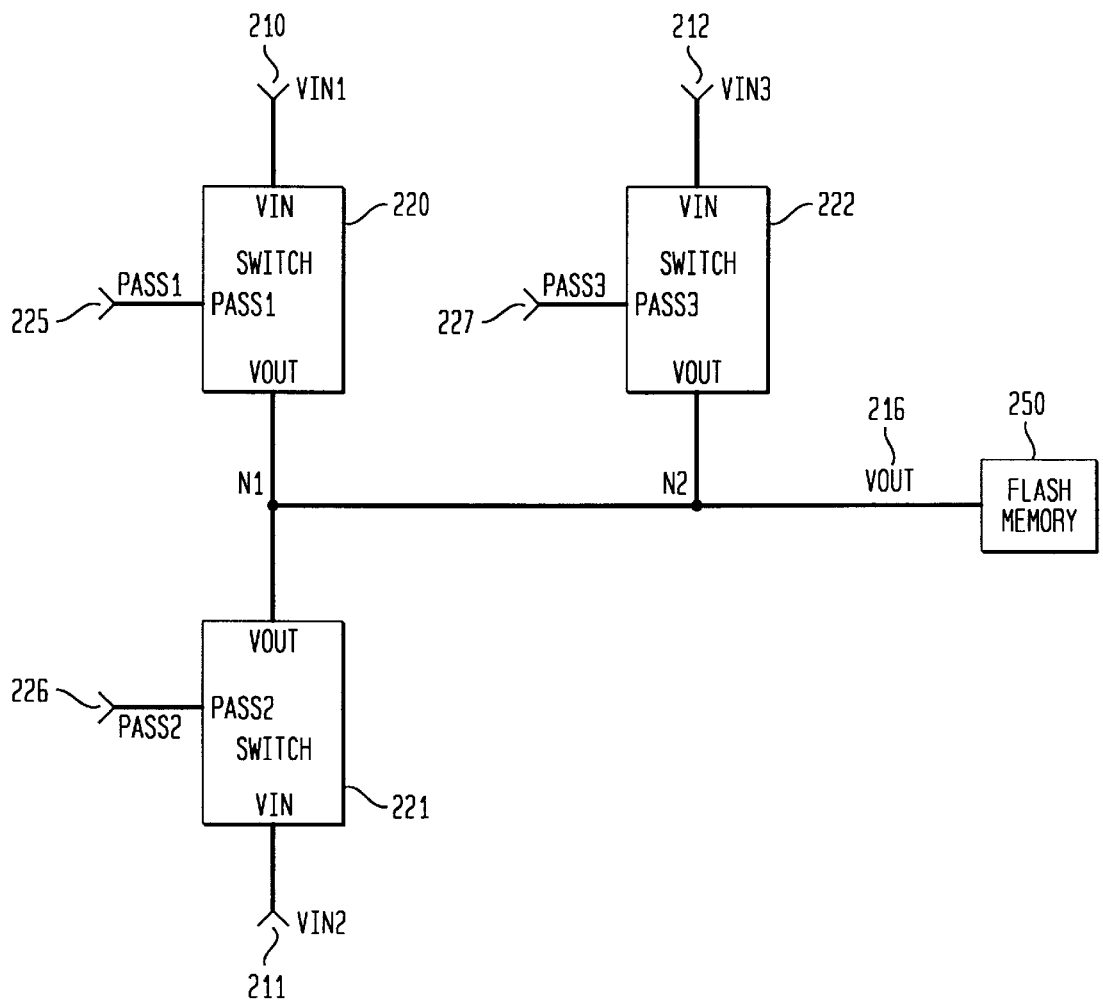
FIG. 3 illustrates in block diagram form an example in which the circuit of the present invention would be used to supply multiple voltages.

FIG. 3 illustrates in block diagram form an example in which the circuit of the present invention would be used to supply multiple voltages for use in an application, such as biasing the wordlines of a Flash memory. Flash memory wordlines usually should be supplied with a power supply voltage 3.3V in normal read operation, with 1.5–3.0V in margin mode read operation and in Vt convergence after erase operation, and with 5.0–7.0V in write operation.

Each of switches 220, 221, 222 consists of the double transistor construction as described with reference to FIG. 2. Switch 220 is controlled by control signal PASS1 225, switch 221 is controlled by control signal PASS2 226 and switch 222 is controlled by control signal PASS3 227. Vin1 210 is the input voltage to switch 220, and could be for example 1.5–3.0V for margin mode read and convergence operations. Vin2 211 is the input voltage to switch 221, and could be for example power supply voltage 3.3V for read operations. Vin3 212 is the input voltage to switch 222, and could be for example 5–7V for write operations. The output voltage Vout from each of switches 220, 221 is connected at node N1 to Vout line 216, and the output voltage Vout from switch 222 is connected at node N2 to Vout line 216. Vout line 216 would be connected to at least one wordline (not shown) of the Flash memory 250, and the function of the Flash memory 250 controlled by the voltage signal conducted on Vout 216.

In accordance with the present invention, switch 220 would be used to conduct voltage Vin1 210 to Vout 216, while switches 221 and 222 would reliably isolate Vout 216 from Vin2 211 and Vin3 212 respectively, regardless of the polarity of the voltage difference between Vout 216 (connected to Vin1 210 through switch 220) and Vin2 211 or Vin3 212. Thus, Vout 216 (which would be the same as Vin1 210) would not be required to be greater than Vin2 211 minus 0.7V, nor would Vout 216 be required to be greater than Vin2 216 minus Vt to maintain isolation between Vout 216 and Vin2 211. In a similar manner, Vout 216 (which would be the same as Vin1 210) would not be required to be greater than Vin3 212 minus 0.7V, nor would Vout 216 be required to be greater than Vin3 212 minus Vt to maintain isolation between Vout 216 and Vin3 212.

Alternatively, switch 221 would be used to conduct voltage Vin2 211 to Vout 216, while switches 220, 222 would reliably isolate Vout 216 from Vin1 210 and Vin3 212 respectively, regardless of the polarity of the difference between Vout 216 and Vin1 210 or Vin3 212. Switch 222 would be used to conduct voltage Vin3 212 to Vout 216, while switches 220, 221 would reliably isolate Vout 216 from Vin1 210 and Vin2 211 respectively, regardless of the polarity of the difference between Vout 216 and Vin1 210 or Vin2 211. Although only three switches are shown in FIG. 3, the invention is not so limited. In a similar way, an integrated circuit having any number of voltage supplies, each having a respective magnitude, can be switched to the wordlines of the Flash memory while maintaining isolation between the unswitched voltage supplies and the wordlines biased at a higher or lower voltage level.

Figure 4:
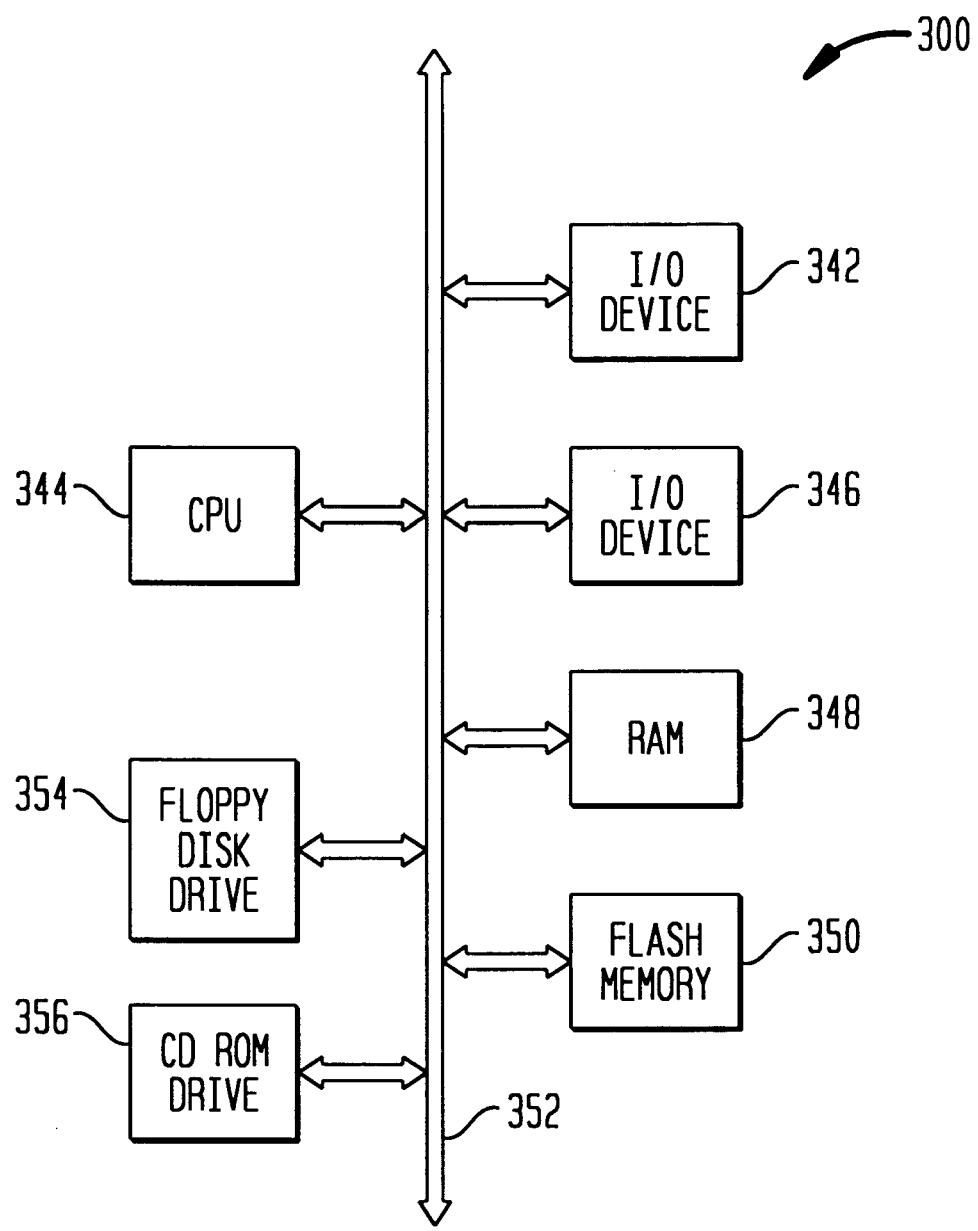
FIG. 4 illustrates in block diagram form a typical processor controlled system in which the present invention would be used.

A typical processor system which includes a Flash memory with voltages supplied to it according to the present invention is illustrated generally at 300 in FIG. 4. A computer system is exemplary of a device having digital circuits which include Flash memory devices. Most conventional computers include memory devices permitting the storage of significant amounts of data. The data is accessed during operation of the computers. Other types of dedicated processing systems, e.g. radio systems, television systems, GPS receiver systems, telephones and telephone systems also contain memory devices which can utilize the present invention.

A processor system, such as a computer system, generally comprises a central processing unit (CPU) 344 that communicates with an input/output (I/O) device 342 over a bus 352. A second I/O device 346 is illustrated, but may not be necessary depending upon the system requirements. The computer system 300 also includes random access memory (RAM) 348, Flash memory 350, and may include peripheral devices such as a floppy disk drive 354 and a compact disk (CD) ROM drive 356 which also communicate with CPU 344 over the bus 352. An integrated circuit which includes a voltage switching circuit, as previously described with respect to FIG. 3, may be placed in the processor system.

Utilizing the method of the present invention, any number of voltage supplies, even with varying amplitudes, can be switched to the wordlines of Flash memory 350 while maintaining isolation between the voltage supply and the wordlines biased at a higher or lower voltage by other sources of voltage supply. It must be noted that the exact architecture of the computer system 300 is not important and that any combination of computer compatible devices may be incorporated into the system.

Reference has been made to a preferred embodiment in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. An integrated circuit for conducting a supply voltage from a voltage source to an output line connected to a memory device, said voltage source being connected to an input line, said integrated circuit comprising:

a first switch having an input connected to said input line and an output;

a second switch having an input connected to said output of said first switch, and an output connected to said output line; and control circuitry to control said first switch and said second witch, whereby when said first switch and said second switch are turned on, said supply voltage is conducted from said input line through said first switch and said second switch to said output line, and when said first switch and said second switch are turned off; said input line is isolated from said output line no matter what voltage is present on said output line, said first switch being turned off by biasing said first switch with said supply voltage from said voltage source, and said second switch being turned off by biasing said second switch with a voltage present on said output line.

2. The integrated circuit according to claim 1, wherein said first switch is a first transistor and said second switch is a second transistor.

3. The integrated circuit according to claim 1, wherein said memory device is a Flash memory array and said output line is connected to at least one wordline of said Flash memory array, and said supply voltage conducted from said input line to said output line through said first and second switch controls an operation of said Flash memory array.

4. An integrated circuit for conducting one of a plurality of supply voltages, each of said plurality of supply voltages being associated with a respective one of a plurality of input lines, to an output line connected to a memory device while maintaining isolation between said plurality of supply voltages not conducted to said output line and said output line, said circuit comprising:

a plurality of switches, each of said plurality of switches having an input connected to a respective one of said input lines and an output connected to said output line, each of said plurality of switches including a first switch having an input connected to said respective one of said input lines and an output, and a second switch having an input connected to said output of said first switch and an output connected to said output line, said first switch being turned off by biasing said first switch with said supply voltage associated with said respective one of said input lines, said second switch being turned off by biasing said second switch with a voltage present on said output line, wherein each of said plurality of switches conducts said supply voltage associated with said input line connected to said switch to said output line when said switch is turned on, and each of said plurality of switches isolates said input line connected to said switch from said output line when said switch is turned off, each of said switches being configured to isolate said respective input line from said output line regardless of a voltage level on said respective input line and said output line.

5. The integrated circuit according to claim 4, wherein each of said plurality of switches further comprises:

control circuitry to control said first switch and said second switch, whereby when said first switch and said second switch are turned on, said supply voltage is conducted from said input line through said first switch and said second switch to said output line, and when said first switch and said second switch are turned off, said input line is isolated from said output line no matter what voltage is present on said output line.

6. The integrated circuit according to claim 5, wherein said first switch is a first transistor and said second switch is a second transistor.

7. The integrated circuit according to claim 6, wherein said memory device is a Flash memory array and said output line is connected to at least one wordline of said Flash memory array, and said supply voltage conducted from said respective one of said input lines to said output line through said first and second transistor controls an operation of said Flash memory.

8. An integrated circuit comprising:

a memory device, said memory device comprising at least one electrically programmable and electrically erasable memory cell;

at least one wordline to access said memory cell;

a plurality of supply voltage conductors, each of said plurality of supply voltage conductors carrying a respective one of a plurality of supply voltages used to control a different operation of said memory cell, each of said plurality of supply voltages being associated with a respective one of a plurality of input lines; and a plurality of switches to conduct said plurality of supply voltages from said plurality of input lines to said at least one wordline, each of said plurality of switches associated with a respective one of said plurality of input lines, each of said plurality of switches comprising:

a first switch having an input connected to said respective one of said plurality of input lines and an output;

a second switch having an input connected to said output of said first switch and an output connected to said output line; and control circuitry to control said first switch and said second switch, whereby when said first switch and said second switch are turned on, said supply voltage is conducted from said respective one of said input lines through said first switch and said second switch to said at least one wordline, and when said first switch and said second switch are turned off, said respective one of said input lines is isolated from said at least one wordline regardless of a voltage level present on said respective one of said input lines and said output line, said first switch being turned off by biasing said first switch with said supply voltage associated with said respective one of said input lines, and said second switch being turned off by biasing said second switch with a voltage present on said output line.

9. The integrated circuit according to claim 8, wherein said first switch is a first transistor and said second switch is a second transistor.

10. A processor system comprising:

a central processing unit; and an integrated circuit, said integrated circuit comprising a memory device, said memory device comprising at least one electrically programmable and electrically erasable memory cell;

at least one wordline to access said memory cell;

a plurality of supply voltages, each of said plurality of supply voltages being used to control a different operation of said memory cell, each of said plurality of supply voltages being associated with a respective one of a plurality of input lines; and a plurality of switches to conduct said plurality of supply voltages from said plurality of input lines to said at least one wordline, each of said plurality of switches associated with a respective one of said plurality of input lines, each of said plurality of switches comprising:

a first switch having an input connected to said respective one of said plurality of input lines and an output;

a second switch having an input connected to said output of said first switch and an output connected to said output line; and control circuitry to control said first switch and said second switch, whereby when said first switch and said second switch are turned on, said supply voltage is conducted from said respective one of said input lines through said first switch and said second switch to said at least one wordline, and when said first switch and said second switch are turned off, said respective one of said input lines is isolated from said at least one wordline no matter what voltage is present on said at least one wordline, said first switch being turned off by biasing said first switch with said supply voltage associated with said respective one of said input lines, and said second switch being turned off by biasing said second switch with a voltage present on said output line.

11. The processor system according to claim 10, wherein said first switch is a first transistor and said second switch is a second transistor.

12. A method for conducting a supply voltage associated with an input line to an output line connected to memory device, said method comprising the step of:

connecting an input of a first switch to said input line;

connecting an input of a second switch to an output of said first switch;

connecting an output of said second switch to said output line; and providing a first control signal to turn on said first switch and turn on said second switch;

providing a second control signal to turn off said first switch and said second switch, whereby when said first switch and said second switch are turned on, said supply voltage is conducted from said input line through said first switch and said second switch to said output line, and when said first switch and said second switch are turned off, said input line is isolated from said output line regardless of a voltage level on said input line and said output line, said first switch being turned off by biasing said first switch with a voltage present on said input line, said second switch being turned off by biasing said second switch with a voltage present on said output line.

13. The method according to claim 12, wherein said memory device is a Flash memory array, said method further comprising the step of:

connecting said output line to at least one wordline of said Flash memory array, wherein said supply voltage conducted from said input line to said output line through said first and second switch controls an operation of said Flash memory array.

14. A method for conducting one of a plurality of supply voltages, each of said plurality of supply voltages being connected to a respective one of a plurality of input lines, to an output line connected to a memory device while maintaining isolation between said plurality of supply voltages not conducted to said output line and said output line, said method comprising the steps of:

turning on a respective one of a plurality of switches, each of said plurality of switches comprising a first switch and a second switch, said first switch having an input connected to said respective one of said plurality of input lines and an output connected to an input of said second switch, said output line being connected to an output of said second switch, said first switch being turned off by biasing said first switch with a voltage present on said respective one of said plurality of input lines, said second switch being turned off by biasing said second switch with a voltage present on said output line; and maintaining all other of said plurality of switches in an off state, wherein said respective one of said plurality of switches turned on conducts said supply voltage connected to said respective one of said plurality of input lines to said output line, and said all other of said plurality of switches maintained in an off state isolate said respective one of said plurality of input lines from said output line no matter what voltage exists on said output line.

15. The method according to claim 14, wherein said memory device is a Flash memory array, said method further comprising the step of:

connecting said output line to at least one wordline of said Flash memory array, wherein said supply voltage conducted from said respective one of said plurality of input lines to said output line through said first and second switch controls an operation of said Flash memory array.

* * * * *